United States Patent [19]
Edelberg et al.

[11] 4,064,556
[45] Dec. 20, 1977

[54] PACKED LOOP MEMORY WITH DATA MANIPULATION CAPABILITIES

[75] Inventors: Murray Edelberg, Carlisle; Theodore H. Bonn, Newton Centre; Lloyd R. Schissler, Jamaica Plain, all of Mass.

[73] Assignee: Sperry Rand Corporation, New York, N.Y.

[21] Appl. No.: 589,321

[22] Filed: June 23, 1975

[51] Int. Cl.² ............................................. G06F 7/24
[52] U.S. Cl. .................................................... 364/900
[58] Field of Search .......................... 340/172.5; 445/1

[56] References Cited
U.S. PATENT DOCUMENTS

| | | | |
|---|---|---|---|
| 3,015,089 | 12/1961 | Armstrong | 340/172.5 |
| 3,748,647 | 7/1973 | Ashany et al. | 340/172.5 |

*Primary Examiner*—Melvin B. Chapnick
*Attorney, Agent, or Firm*—Howard P. Terry

[57] ABSTRACT

A digital memory comprising a multiplicity of circulating storage loops, in each of which, a plurality of digital data records are stored, and apparatus for sorting the data records. More particularly, a plurality of distributed processing elements perform a parallel sorting operation of each column of data records, where each column of data records is comprised of one data record in each circulating storage loop and the data records comprising each column are disposed in the same record position within their respective circulating storage loops. Thereafter, the apparatus performs a "precession" of the data records whereby the data records in each circulating storage loop are shifted one record position, in a common direction, with respect to the data records stored in the next preceding circulating storage loop. The apparatus repeats the column sorting operation and the precessions alternately until the column sort has been performed a number of times equal to the number of data record positions in each circulating storage loop. At this point the memory contents are sorted into "buckets," that is, the data records in each circulating loop are sorted with respect to the data records in every remaining loop though not necessarily with respect to each other. Apparatus is also provided to perform a final sort of the data records within each circulating storage loop. Additionally, the processing elements may be arranged to perform a variety of functions such as searching, retrieval, updating, and dynamic reconfiguration of the memory.

12 Claims, 14 Drawing Figures

| PRESENT STATE \ NEW STATE | REST | = | < | > |
|---|---|---|---|---|
| REST | $\phi$ | $bKF \cdot \overline{IDLE}$ | — | — |
| = | $bKF \cdot IDLE$ | $\phi$ | $\overline{X_i} \cdot X_{i+1} \cdot KF$ | $X_i \cdot \overline{X_{i+1}} \cdot KF$ |
| < | $bKF \cdot IDLE$ | $bKF \cdot \overline{IDLE}$ | $\phi$ | — |
| > | $bKF \cdot IDLE$ | $bKF \cdot \overline{IDLE}$ | — | $\phi$ |

| | $z_1$ | $z_2$ | $z_3$ | $z_4$ | $z_5$ | $z_6$ | $z_7$ | $z_8$ | $z_9$ | $z_{10}$ | $z_{11}$ | $z_{12}$ |
|---|---|---|---|---|---|---|---|---|---|---|---|---|
| AFTER PRESET | 0 | 1 | 1 | 1 | 1 | 0 | 1 | 1 | 1 | 1 | 0 | 1 |
| STEP 3 (1) | 0 | 0 | 1 | 1 | 1 | 0 | 0 | 1 | 1 | 1 | 0 | 0 |
| STEP 3 (2) | 0 | 0 | 0 | 1 | 1 | 0 | 0 | 0 | 1 | 1 | 0 | 0 |
| STEP 3 (3) | 0 | 0 | 0 | 0 | 1 | 0 | 0 | 0 | 0 | 1 | 0 | 0 |
| STEP 6a | 1 | 0 | 0 | 0 | 0 | 1 | 0 | 0 | 0 | 0 | 1 | 0 |
| STEP 6b | 0 | 1 | 1 | 1 | 1 | 0 | 1 | 1 | 1 | 1 | 0 | 1 |

FIG. 14.

PACKED LOOP MEMORY WITH DATA MANIPULATION CAPABILITIES

BACKGROUND OF THE INVENTION

1. Field of the Invention

The present invention pertains to the field of digital computer memories and particularly to dynamic memories in which there is a continuous circulation of data.

2. Description of the Prior Art

In copending application Ser. No. 578,685, entitled "Digital Memory with Data Manipulation Capabilities," filed on May 19, 1975, in the names of Murray Edelberg and Lloyd R. Schissler, and assigned to the assignee of the present invention, and hereby incorporated by reference into the present application, a computer memory is disclosed which is formed of serial circulating storage loops and distributed processing logic, preferably for application with CCD (charge-coupled devices) or magnetic bubble memory technologies. In addition to the basic information storage function, the memory performs high speed, off-line sorting, associative searching, updating and retrieval. As disclosed in Ser. No. 578,685, the memory stores one data record per loop (single record storage loop) and is capable of dynamically altering its loop size to accommodate varying record length requirements.

There are, however, economical and technological reasons why alternatives to single record storage loops are desirable. For example, while on-chip logic for the processing element is reasonable for CCD memories, it does not, at present, appear feasible for magnetic bubble memories. With off-chip logic, long storage loops (longer than the single record storge loops for storing multiple records) are required in order to maintain reasonable pin counts. Furthermore, longer storage loops result in lower ratios of processing element chip area to storage loop area and thus lower memory system cost per bit of storage.

The conversion of the intelligent memory described in Ser. No. 578,685 to accommodate long storage loops into which multiple data records are packed is, in some respects, straight-forward. It can be appreciated, however, that the sort mode of operation for a packed storage loop memory system presents a serious obstacle which must be overcome in order to extend the intelligent memory system of Ser. No. 578,685 to packed circulating storage loops (packed with multiple records).

SUMMARY OF THE INVENTION

The present invention comprises apparatus for sorting the contents of a memory system in which a multiplicity of packed circulating storage loops are utilized, each of which stores a plurality of data records. The invention can be incorporated into any circulating loop memory as well as the intelligent memory detailed in the Description of the Prior Art.

More particularly, a plurality of data processing circuit elements are distributed among the storage loops such that each is serially coupled in each of two storage loops and each storage loop is serially coupled to two of the processing elements at different points in the loop. The processing elements are capable of performing serial comparisons and serial interchanges with respect to data records occupying the same relative record position within each loop. Thereafter, additional apparatus initiates a "precession" of the memory contents wherein, a precession is effectuated by shifting the data records of each successive storage loop one record position in a common direction with respect to the data records in the next preceding storage loop. Both of the aforementioned operations are alternately performed until the sorting operation has been performed a number of times equal to the number of data records stored in each loop.

The apparatus for precessing the memory contents may include means for disconnecting a portion of selected storage loops and preventing the contents therein from circulating with the remainder of the loop contents. This isolation creates a shift in the data records of the loop with respect to loops where the isolation was not invoked.

Additionally, the processing elements may be constructed and arranged to perform additional data manipulation operations such as searching, data retrieval, updating, retrieval, etc.

DESCRIPTION OF THE PREFERRED EMBODIMENT

The following general discussion is provided to assist in an understanding of the invention.

Data processing systems are utilized that comprise central processing units (CPU) as well as storage for data files. Such storage may take the form of magnetic tape, discs, drums and the like. For example, a file may comprise data records for all of the employees in a corporation and may be utilized, for example, in performing the payroll function such as printing paychecks and payroll reports for management. Each data record may comprise, in this example, the employee's name, pay rate and other pertinent employee data. Thus each data record would comprise all of the data concerning a particular employee and the data file would comprise all such employee data records. In a well known manner the data is stored as binary words in appropriate binary coded representation. For various data processing purposes it may be desirable to sort the records of the file in accordance with particular fields thereof. For example, it may be desirable to arrange the records in ascending alphabetical order in accordance with employee last name. For other purposes it may be desirable to sort the records, for example, in decending order with respect to employee years of service. In the prior art the records of the file would be transferred to the central processing unit wherein a conventional sort routine would be applied thereto with the sorted records being transferred back to file storage. It is appreciated that in a well known manner the sort routine operates on the numerical binary coded data representations in order to achieve the sorting function. These data processing functions and formats are well known to those skilled in the art.

Said co-pending application Ser. No. 578,685, incorporated by reference herein, teaches a memory comprising circulating storage loops which itself can perform data processing functions including sorting of data records. As discussed in said Ser. No. 578,685, the data processing capability of the memory permits the CPU to be more effectively utilized for other tasks. Although not limited thereto, the memory of said Ser. No. 578,685 was described in terms of one data record of the type discussed above stored in each of the circulating loops. Thus each loop stores a single data record giving rise to the phrase "single record storage loop" as designated herein.

For the reasons discussed herein, it is often desirable to use "long storage loops" as compared to the loop lengths of said Ser. No. 578,685 for the purpose of storing multiple data records per loop. In other words, more than one data record is stored or "packed" into each loop giving rise to the term "packed circulating storage loops" as designated herein.

The data records stored in memory generally all have the same predetermined data format. For instance, in the employee data example given above, the first ten bytes of the record may be reserved for the last name with the next ten bytes reserved for the first name. Further predetermined fields of the record may be utilized for such items as pay rate, years of service, employee number, etc. As discussed above, the circulating loops of the memory of said Ser. No. 578,685 each contains a single data record. As generally described in Ser. No. 578,685, similar data fields are aligned with respect to each other such that the same data fields in all of the circulating data records enter the processing elements at the same time.

Thus, as described in said Ser. No. 578,685, a key field signal is applied to the processing elements when the field on which the records are to be stored enters therein such that the sort is performed on the selected data field. As described herein, a plurality of records is stored in each loop with the records in each loop aligned with the records in the adjacent loops with the data fields of the records in adjacent loop aligned with respect to each other. Thus the memory of the present invention may be schematically conceptualized as a plurality of circulating data loops stacked one above the other in cylindrical fashion with the data fields in the plurality of records in each loop aligned in columns. Thus the similar fields of the various records in the various loops enter the processing elements of the memory simultaneously with respect to each other in the manner described in said Ser. No. 578,685. Therefore, as the selected data field of a column of records enters the processing elements the key field signal is energized which effects a sort of the records in that column with respect to the selected data field in the manner described in said Ser. No. 578,685. This procedure gives rise to the term "column sort" as utilized herein.

Since in Ser. No. 578,685 only one record was stored per loop it was only necessary to effect the sorting procedure once to achieve a sort of the records in the memory. Since in the present embodiment multiple records are stored per loop, it is necessary to apply the key field signal as the desired data field in each column of records enters the processing elements. Thus it is appreciated that the columns of data records are sorted in a manner similar to that described in said Ser. No. 578,685 and the term "column sort" has been utilized to describe the procedure.

As explained herein, the storage loops of said Ser. No. 578,685 are "single record storage loops" in that each loop contained one data record. The loops of the present invention are "long storage loops" in that they are generally longer than the loops of the memory of said Ser. No. 578,685 and are "packed circulating storage loops" for storing a plurality of data records rather than a single data record as in Ser. No. 578,685. The present invention comprises a sorting process, the first step of which is a column sort wherein the columns of records in the circulating loops are each sorted in the manner that the single record array of said Ser. No. 578,685 is sorted.

Figure 1:
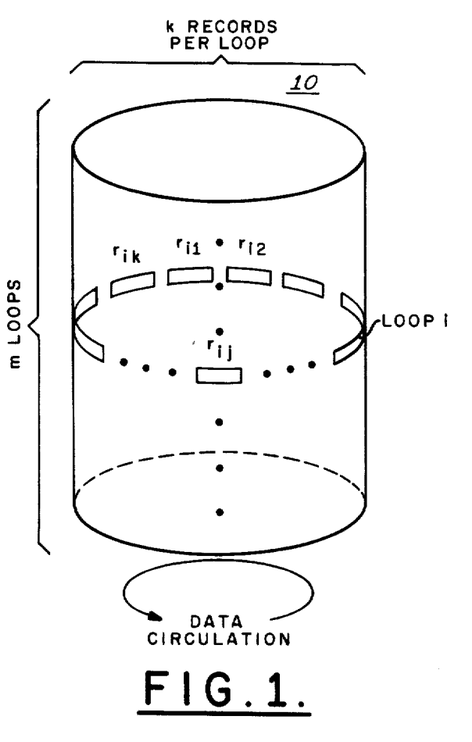
FIG. 1 is a graphic illustration depicting a memory comprised of a plurality of packed circulating storage loops.
Figure 2:
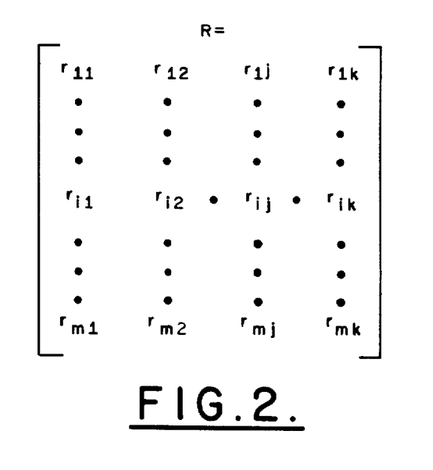
FIG. 2 is a matrix representation of the contents within the memory depicted in FIG. 1.

FIG. 1 depicts a memory system 10 containing $m$ circulating storage loops, each of which stores $k$ data records, yielding a total memory storage capability of $mk$ records. FIG. 2 is a matrix representation of the contents within memory 10. More particularly, the matrix R is an $m \times k$ matrix consisting of $m$ rows and $k$ columns. The matrix R may be represented by the notation $R = [r_{ij}]$ where $r_{ij}$ denotes the $j$th record on storage loop $i$ and where $1 \leq i \leq m$ and $1 \leq j \leq k$.

The apparatus of the present invention utilizes the following technique, hereinafter referred to as "gyro" sort, to sort the $mk$ records in the memory 10. Gyro sort consists of plurality of passes, each of which contains the following two steps: 1) sort columns, and 2) precess rows. The first step is relatively straightforward and consists of arranging the data records of each column in ascending or descending order, whichever is desired.

Figure 3:
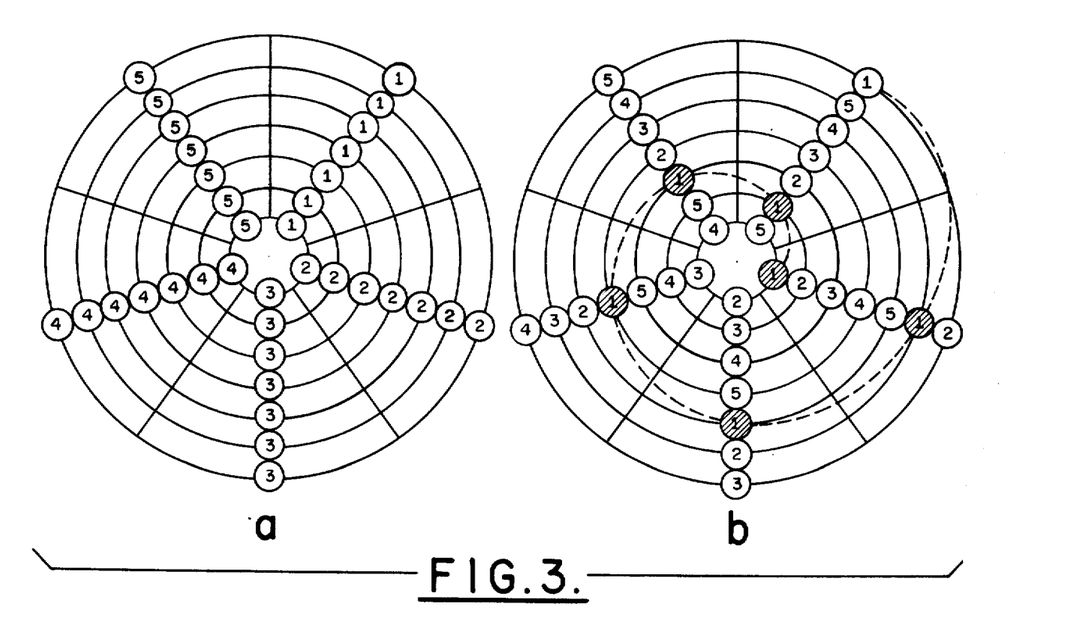
FIG. 3 is a diagram schematically illustrating the technique of precessing packed circulating storage loop memories.

As is well known, the ascending or decending order of the data records refers to the order of the records with respect to the particular key field selected. If the field is a numeric field the order will be numerical. If the field is an alphabetic field the order will be alphabetical. Ultimately, irrespective of the nature of the data, the data is represented by binary numbers which are operated upon by the sorting apparatus of the invention. The second step is more easily described by reference to FIG. 3. FIG. 3a is a top view of a memory, before precession, comprised of $m = 7$ loops and $k = 5$ records per loop. In FIGS. 3a and 3b, the first circulating storage loop ($i = 1$) is depicted as the outermost concentric circle and the encircled numerals indicate the data records stored in each loop.

FIG. 3b depicts the repositioning of the data records resulting from the row precession. In particular, the data records of each successive loop are displaced one record position in a common direction, from the data records in the preceding loop. For example, the first data record in loop 2 is disposed in the second column of data records, the first data record of loop 3 is disposed in the third column etc. It will be noted that in every kth (fifth in this example) loop, there is effectively no shift of the data records therein since the data records located in this loop occupy the same columns (or record positions) before and after precession. The dotted line indicates the spiral movement of the data records which were located in the first column prior to precession. This spiral movement of the data records, superimposed on the loop rotation movement, explains the choice of the terms "precession" and "gyro" sort. It becomes apparent from FIG. 3b that step 2 of a pass of gyro sort may be modified to read: shift each row $i$ a total of $(i-1) \bmod k$ record positions where $(i-1) \bmod k$ is equal to the remainder in a division of $(i-1)$ by $k$.

To further illustrate gyro sort, consider the following numerical example in matrix form. In this example, $m = 6$, $k = 3$, and each data record consists of a single integer. Matrix $R_O$ represents the initial memory contents; matrix $R_1$ represents the contents after a column sort and matrix $R_2$ represents the contents after a row precession and, therefore, indicates the result of a complete pass of gyro sort. For this example, an ascending sort has been chosen wherein it is desired to arrange the integers in increasing order from top to bottom.

$$\begin{pmatrix} 8 & 3 & 12 \\ 11 & 9 & 2 \\ 5 & 14 & 6 \\ 18 & 1 & 7 \\ 10 & 17 & 13 \\ 16 & 4 & 15 \end{pmatrix} \quad \begin{pmatrix} 5 & 1 & 2 \\ 8 & 3 & 6 \\ 10 & 4 & 7 \\ 11 & 9 & 12 \\ 16 & 14 & 13 \\ 18 & 17 & 15 \end{pmatrix} \quad \begin{pmatrix} 5 & 1 & 2 \\ 6 & 8 & 3 \\ 4 & 7 & 10 \\ 11 & 9 & 12 \\ 13 & 16 & 14 \\ 17 & 15 & 18 \end{pmatrix}$$

$$R_0 \qquad\qquad R_1 \qquad\qquad R_2$$

The first step may be accomplished for general records by the sort technique described in said Ser. No. 578,685 and which will be described in greater detail hereinafter. The column sort proceeds in parallel with regard to all columns.

The second pass of gyro sort yields the following results:

$$\begin{pmatrix} 4 & 1 & 2 \\ 5 & 7 & 3 \\ 6 & 8 & 10 \\ 11 & 9 & 12 \\ 13 & 15 & 14 \\ 17 & 16 & 18 \end{pmatrix} \quad \begin{pmatrix} 4 & 1 & 2 \\ 3 & 5 & 7 \\ 8 & 10 & 6 \\ 11 & 9 & 12 \\ 14 & 13 & 15 \\ 16 & 18 & 17 \end{pmatrix}$$

$$R_3 \qquad\qquad R_4$$

where $R_3$ is the result after step 1 and $R_4$ is the result following step 2.

On the third pass we obtain the following after step 1:

$$\begin{pmatrix} 3 & 1 & 2 \\ 4 & 5 & 6 \\ 8 & 9 & 7 \\ 11 & 10 & 12 \\ 14 & 13 & 15 \\ 16 & 18 & 17 \end{pmatrix}$$

-continued $$R_5$$

It will be noted that the data records in each row of the matrix $R_5$ are sorted with respect to the records in each and every other row therein and that further operations of gyro sort are unnecessary. From this example, it was shown that the contents of each circulating storage loop within the memory were sorted with respect to the contents of each and every other circulating storage loop therein after the $k$th iteration of step 1. It can be shown, by mathematical proof not detailed herein, that this proposition holds true for any memory having $m$ loops and $k$ data records per loop.

Figure 4:
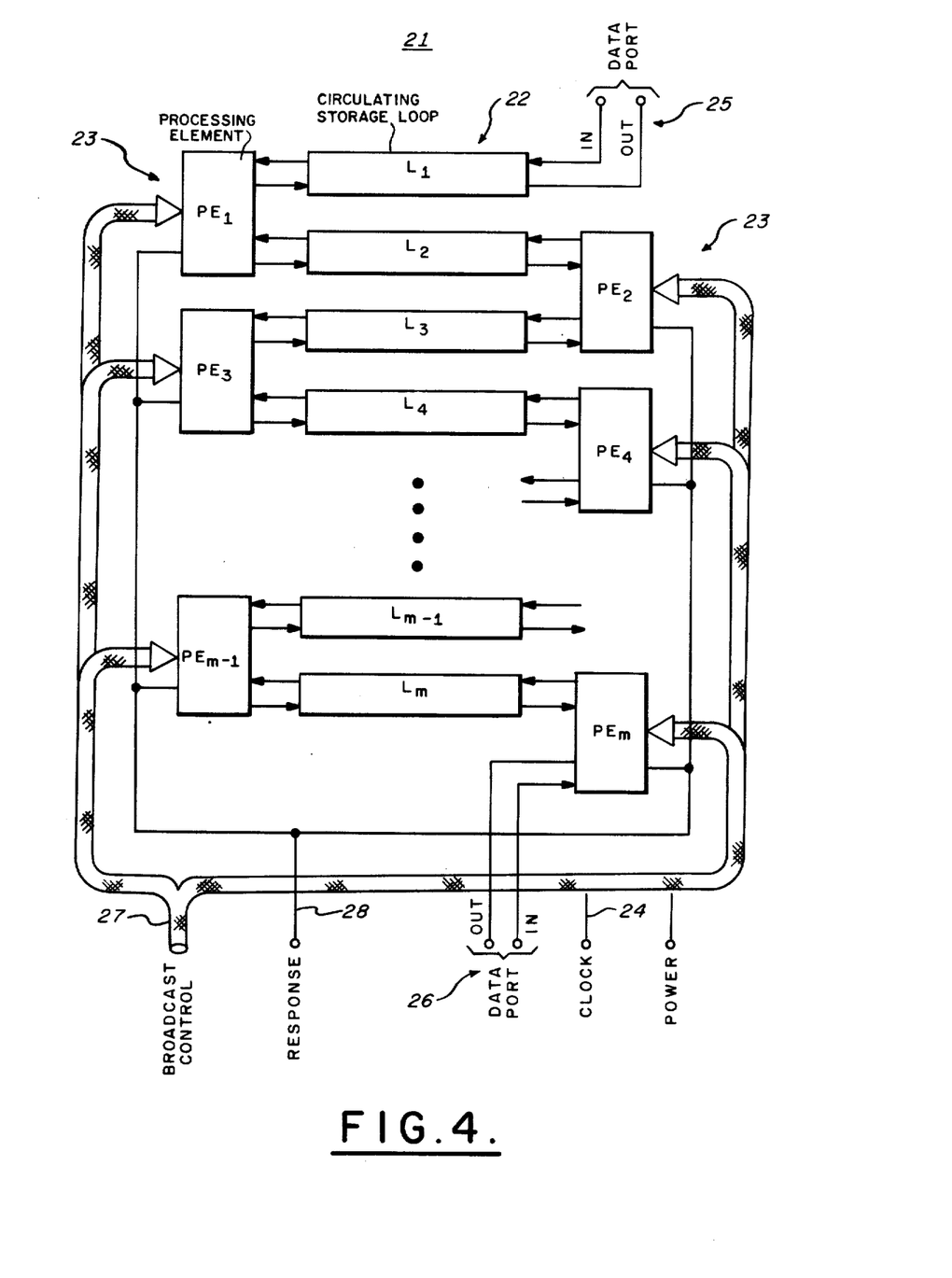
FIG. 4 is a block diagram depicting the present invention in the form of a plurality of packed circulating storage loops and a plurality of distributed processing elements.

FIG. 4 depicts a memory module 21 utilizing the present invention wherein several memory modules 21 may comprise a memory. The module 21 includes a plurality of circulating storage loops 22 designated as $L_1, L_2 \ldots L_m$ and processing elements 23 designated as $PE_1, PE_2 \ldots PE_m$. Each of the storage loops 22 is a circulating shift register and all the loops are shifed by a common clock source applied to a clock terminal 24. The storage loops may be implemented using solid state shift registers, magnetic bubbles, or moving medium magnetic devices such as multiple head-per-track disc or drum or the like. A pair of data ports 25 and 26 are incorporated for the extraction from and injection of data into the module 21. The data manipulation control signals used to operate the module 21, are applied to the broadcast control terminal 27 and a response signal is generated at the $R_i$ terminal 28.

It will be appreciated that the invention may be practiced with respect to the memory module of FIG. 4 and therefore for the purposes of describing the invention only the one module need be considered. For completeness, however, as discussed in said Ser. No. 578,685, several identical memory modules may be utilized to comprise a memory. When two or more modules are utilized in a memory system, identical broadcast control signals are applied to each in parallel and the response signals from each module are connected in an OR function. The plural modules are coupled in series with respect to their chain control lines (as discussed in Ser. No. 578,685) as well as being coupled in series with respect in their data ports, special terminations being required at the data port extremities.

It will be appreciated that FIG. 1 is a schematic representation of one of the modules of the memory where the circulating loops are depicted as being disposed one above the other on the surface of a cylinder, loop $i$ being illustrated, the remaining loops being represented by the vertical row of dots. FIG. 4 is a circuit schematic diagram of the memory module where the connectivity of the loops with respect to the processing elements is illustrated. Thus, as depicted in FIG. 1, the memory module comprises $m$ loops each storing $k$ data records. As previously explained, the data records from loop to loop are arranged in columns. Thus, if one considers each loop as a row, the arrangement of the data records in the memory module may conveniently be depicted as a matrix where each matrix row corresponds to a loop in memory with the records in the row being arranged in the same order as they reside in the memory loop. Each column of the matrix represents the vertical columns of records in the memory as discussed above and in the specification. The order of the records in the columns of the matrix depict the order of the records as they are arranged in the memory.

Just as FIG. 1 was a schematically conceptual illustration of the memory module of FIG. 4, FIG. 3 is a further conceptualized version of the "top view" of FIG. 1. In FIG. 3 each loop of the memory is depicted as a concentric ring with the records in each loop depicted as encircled numbers on the ring. Thus it is appreciated that FIG. 3 is not a structural representation of the memory module and therefore the memory module may not physically contain concentric loops.

With respect to the matrix representation of FIG. 2 depicting the contents of the memory 10 as discussed above, the arrangement of the records in each loop is depicted by the rows of the matrix whereas the arrangement of the records in each column of data records in memory is depicted by the columns of the matrix. Thus, each of the entries in the matrix represents a record in memory. Each record may comprise a plurality of data items in a format dependent upon the particular data processing application. Each matrix entry represents an entire record independent of the record format or content.

As discussed above, the memory of the present invention may reside in a data processing system for storing and sorting the records of a data file. Any kind of the commonly encountered data records may be involved and these records may be sorted on any data field desired. The invention has application in any system wherein it is desirable to incorporate the sorting function into the memory. The invention may also be utilized in a memory such as that described in said Ser. No. 578,685 wherein the memory embodies a plurality of data processing functions in addition to sorting. The specific manner in which the sort is performed in the present invention is described in detail herein.

Generally, all of the columns of records are sorted in accordance with the method described in said Ser. No. 578,685 and as further discussed above. After this column sort is performed the data records in each loop are displaced one record position with respect to the records in the adjacent loop. This procedure is called "precession." As described herein, the data records in memory are sorted by alternately performing the column sorting operation and the precession operation and this sorting procedure is designated as "gyro sort" because the motion of the data records under the sorting and precession operations superimposed on the normal circulation of the data in the loops is reminiscent of the action and precession of a gyroscope.

Further with respect to sorting example given above, $R_O$ depicts the arrangement of records prior to the sort. After performing a column sort the records in each column are in ascending numerical order as illustrated in $R_1$. It is observed that after the column sort the record, for example, having the vlue "16" is in a higher row than the record having the value "15". Thus, precession is performed which displaces each row one record position with respect to the adjacent row such that the next column sort will rearrange these two records amongst others that require rearranging. Alternating the column sorting and precession operations results in the sorted arrangement shown in $R_5$.

Figure 5:
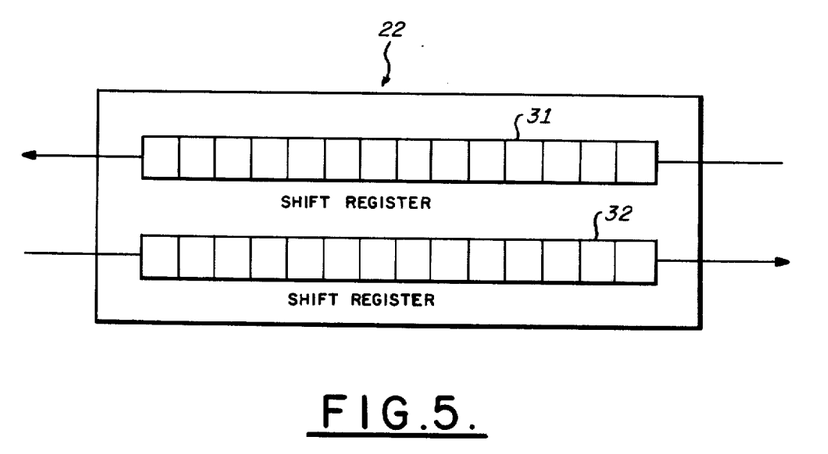
FIG. 5 is a block diagram useful in understanding the apparatus comprising a circulating storage loop.
Figure 6:
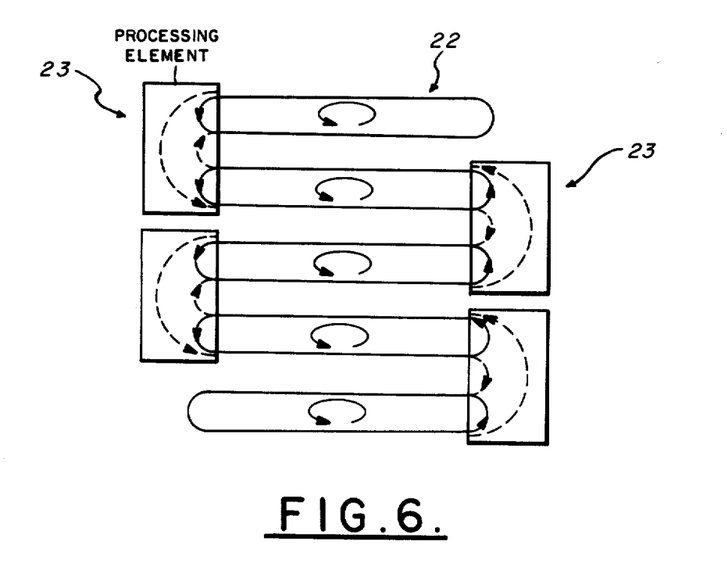
FIG. 6 is a graphic illustration showing the loop connection states of the processing element.

FIG. 5 illustrates a typical storage loop 22 which comprises two shift registers 31 and 32 which may be connected in loop fashion through the processing elements 23 or in interchange fashion with respect to a loop adjacent thereto. Referring to FIG. 6, the solid lines within each processing element 23 represent the through state which isolates the two storage loops 22 incident therewith whereas the dashed-line arrows within the processing elements 23 indicate the interchange state which effects an interchange of the contents of these loops.

Referring again to FIG. 4, it is apparent that processing element $PE_1$ is incident with storage loops $L_i$ and $L_{i+1}$ such that each processing element 23 is coupled with two adjacent loops 22 and each of the loops 22 is coupled to two processing elements 23 at points on the loop that are spaced one-half loop length from each other. Moreover, the processing elements 23 are divided into two phases — odd and even, such that, the processing elements 23 in the lefthand column may be thought of as in the odd phase while the remaining processing elements, in the righthand column, may be thought of as in the even phase.

Table 1 lists the various broadcast control signals which are utilized to operate the memory in its simplest form:

TABLE 1

| MODE | $\begin{cases} \text{SORT}< \\ \text{SORT}> \\ \text{IDLE} \end{cases}$ |
|---|---|
| KFE | |
| KFO | |

As listed, the modes include SORT > and SORT < representing the descending and ascending SORT modes, respectively, as well as the idle mode in which the memory performs the conventional data storage function.

The data manipulation control signals require two broadcast control lines for the three modes enumerated above. Additionally, separate broadcast control signal is required for each of the odd and even phases of the processing elements 23, i.e., KFO and KFE, respectively, over which the key field defining pulses are transmitted to the odd and even phase processing elements when the described bits of the data field are traversing the associated processing elements.

Figure 7:
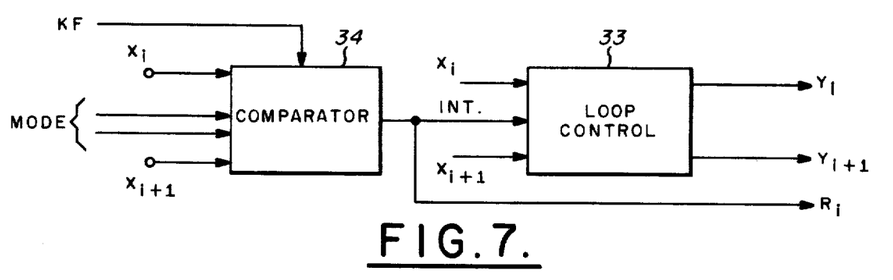
FIG. 7 is a block diagram illustrating the contents of a processing element.

Referring now to FIG. 7, a block diagram of a processing element (for example, $PE_i$) is illustrated. The processing element $PE_i$, for application with the simple form of the memory described above, is comprised of a loop control portion 33 and a comparator portion 34. The loop control 33 receives data inputs $X_i$ and $X_{i+1}$ from incident loops $L_i$ and $L_{i+1}$, respectively, and provides respective outputs $Y_i$ and $Y_{i+1}$ to these loops. The loop control 33 maintains an appropriate loop connection state between incident loop $L_i$ and $L_{i+1}$ as a function of the interchange signal from the comparator 34. Specifically, in the absence of an interchange signal, the loop control 33 maintains the processing element $PE_i$ in the through state and, in the presence of an interchange signal, switches the processing element $PE_i$ to the interchange state.

Figure 8:
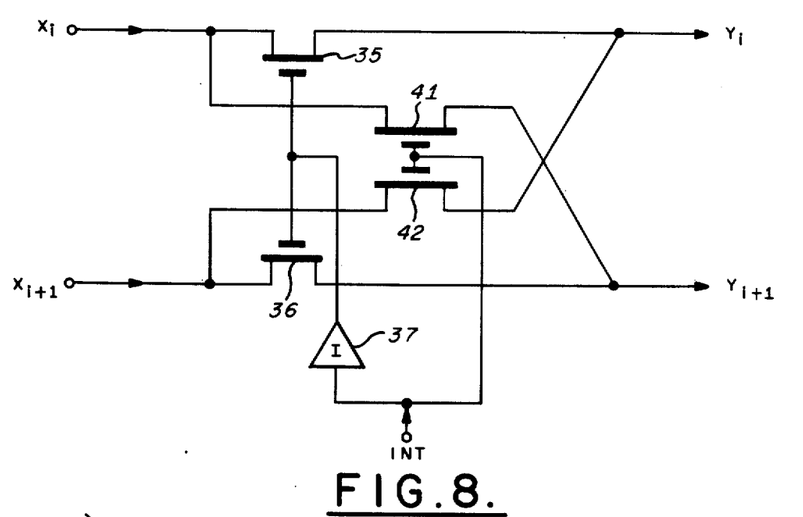
FIG. 8 is a schematic diagram illustrating the operation of the loop control portion of a processing element.

Referring for the moment to FIG. 8, a schematic circuit for the loop control 33 is illustrated utilizing the symbology of MOSFET transmission gates. In the through state, i.e., the absence of an interchange signal, transistors 35 and 36 maintain a connection between $X_i$ and $Y_i$ and between $X_{i+1}$ and $Y_{i+1}$ due to the inverter gate 37, while transistors 41 and 42 remain non-conductive. An interchange signal, developed by comparator 34, causes transistors 35 and 36 to assume the non-conductive state and transistors 41 and 42 to assume the conductive state thereby interchanging the inputs with their respective outputs.

Referring again to FIG. 7, the comparator 34 of the processing element $PE_i$ is coupled to receive the mode control signals and the key field signal KF from the broadcast control line as indicated in FIG. 4 as well as the inputs $X_i$ and $X_{i+1}$ from the incident storage loops $L_i$ and $L_{i+1}$, respectively. The comparator 34 performs serial comparisons between the data stored in the incident loops $L_i$ and $L_{i+1}$ and serial interchanges therebetween as required.

For the simplified memory under discussion, the comparator 34 is comprised of a sequential logic circuit and an output logic circuit. The sequential logic circuit computes a sequential function of its inputs $X_1$, $X_{i+1}$, MODE, KF, and has four internal states denoted REST, EQUAL (=), LESS THAN (<), and GREATER THAN (>). The outputs < and > from the sequential logic circuit are derived directly from the two corresponding states thereof in a conventional manner. The sequential logic circuit may be readily configured in accordance with the well known precepts of sequential logic theory as explained for example, in the textbook "Switching and Finite Automata Theory" by Zvi Kohavi, published by McGraw-Hill Book Company in 1970. A further appreciation for the discipline of sequential logic theory may be had from the textbook "Finite State Models for Logical Machines," by F. C. Hennie, published by John Wiley & Sons, Inc. in 1968. A still further appreciation for the discipline of sequential logic theory may be had from the textbook "Switching Circuits and Logical Design" by Samuel H. Caldwell, published by John Wiley and Sons, Inc. in 1958. Chapters 12-15 should be consulted in the Caldwell text and pages 241-263 may be consulted in the Kohavi test. The Hennie textbook is of general informative interest with respect to the discipline of sequential logic theory. The sequential logic circuit is designed in accordance with the discipline of sequential logic theory and from the transition logic table in FIG. 9.

Figure 9:
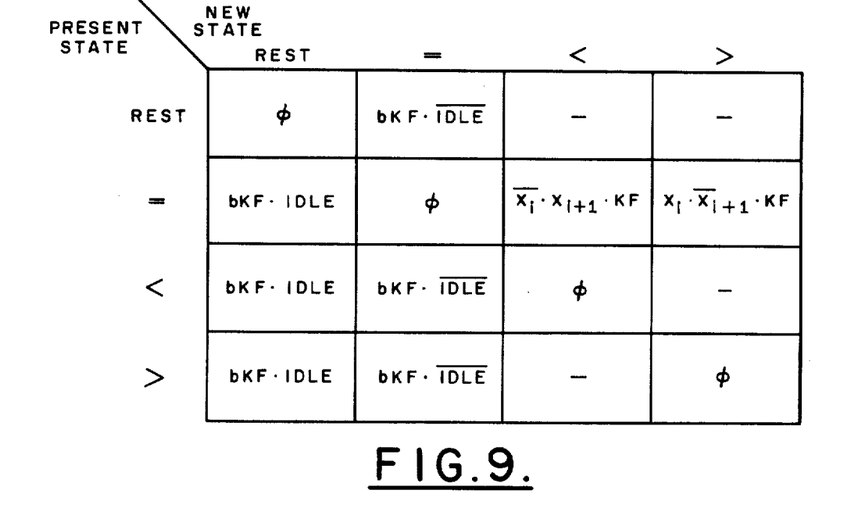
FIG. 9 is a sequential logic table denoting the operation of the comparator portion of a processing element.

The dashed entries in FIG. 9 (those boxes of FIG. 9 that contain only dashes) represent the forbidden transitions while the entry $\phi$ denotes any combination of input values other than those satisfying the given transition logic equations. It will further be appreciated that the signal bKF in FIG. 9 is a pulse signal that coincides with the leading edge of the KF signal and is derived by conventional circuitry (not shown) within the sequential logic circuitry. Furthermore, the KF signal is constrained to begin at the point where each data record in a loop enters the associated processing element. This insures that the compare/interchange function can be completed during one record interval. It is to be understood, further, that the designation KF is a generality which represents both KFO and KFE depending on whether the processing element $PE_i$ is in the odd or even phase respectively.

The output logic circuitry provides an INT signal as combinational functions of the input signals MODE, <, >, in accordance with the following logic equation:

$$INT = (SORT<) \cdot (>) + (SORT>) \cdot (<) \qquad (1)$$

The logic equation is implemented in a conventional manner by AND gates and OR gates.

As previously described, broadcast signals KFE, KFO are applied to the processing elements of the memory. Signals KFE (key field-even) and KFO (key field-odd) define the block of contiguous bit positions starting at the beginning of each data record on which a sort is to be performed. There are two such signals, since the processing elements are divided into two groups or phases, even and odd, which receive any specified group of bits at times $lt/2$ apart where $lt$ is the loop cycle time in seconds and where $l$ is the loop size in bits and $t$ is one bit transfer time in seconds as explained in said Ser. No. 578,685.

To perform a sort operation, the control inputs to the memory comprises the sort key field definition signals KFE and KFO and the mode signal equal to either SORT <, or SORT >, depending on whether an ascending or descending column sort is desired. The externally specified sort key field may comprise any block of contiguous bit positions within the data record starting with the first bit therein. The operation of a processing element, for example $PE_i$, during one complete cycle of its incident loops $L_i$ and $L_{i+1}$ is as follows. The cycle begins when the key field portions of the first data records, which are stored, for example, as one of the $k$ records in each loop, enter $PE_i$, high order bits first. When the leading edge of the KF signal enters the sequential logic circuit, the bKF pulse is generated which sequences the sequential logic circuit to the equal state. This is appreciated from FIG. 9, since irrespective of the present state of the sequential logic circuit, the circuit will sequence to its equal state in response to the conjunctive combination of the bKF pulse and either SORT mode. When the sequential logic circuit is in the equal state, and a SORT mode is broadcast, the INT output from the output logic circuit is low which places the loop control circuit 33 in FIG. 7 in the through state.

The sort cycle continues with the key field portions of the data records from the incident loops $L_i$ and $L_{i+1}$ entering $PE_i$, high order bits first. As long as the two bit streams remain equal, $PE_i$ maintains the through connection state. The first mixed pair of bits causes $PE_i$ to assume either the through state or the interchange state, whichever routes the zero bit to $L_i$ if SORT < is specified, or to $L_{i+1}$ if SORT > is specified and to maintain that connection state for the remainder of the two data records being compared. Equal key fields cause $PE_i$ to maintain the through connection for the full circulation of the data record through the processing element. This may be appreciated from FIG. 9 where it is noted that when the sequential logic circuit is in the present state =, the mode SORT < or SORT > is broadcast and the KF is high, a mixed pair of bits will cause the sequential logic circuit to assume either the < or > state in accordance with the transitional logic delineated in FIG. 9. Equation (1) indicates that the INT (interchange) signal will be high or low in accordance with the INT equation thereby setting the loop control of $PE_i$ into either the through or the interchange state dependent upon the requirements of the sort and the incident data. Once the sequential logic circuit enters the < or the > state, during a SORT mode, it must remain in that state until the next occurring KF cycle. This is appreciated from FIG. 9 where it is noted that when the present state is in the < or >, the machine requires the next occurring bKF pulse to sequence back to the equal state.

A new key field (KF) signal and hence a new comparison is generated with the entry of each data record into the associated processing element.

The memory correctly performs a stable sort of the contents in each column. The term "stable sort" is well known in the art and has the following meaning. Prior to a sort, data records may be loaded into or may reside in memory in an arbitrary order. If amongst the records there are two records that have identical data in the field on which the sort is to be performed, the sorting procedure will dispose these two records adjacent each other maintaining the order with respect to each other that they were in prior to the sort. Thus a stable sort preserves the original order of identical data items. It can be shown that the maximum sort time for either the ascending or descending sort modes is $mlt/2$ seconds where $m$, $l$ and $t$ are defined as explained above. Typically, however, the maximum time is not required. Therefore, a response line (designated $R_l$ in FIG. 7) coupled to all processing elements as depicted in FIGS. 4 and 7, is provided to generate a sort completion signal. The sort completion signal is generated by straightforward logic (not shown) that detects that the response line 28 has remained low during one complete rotation when a sort mode is broadcast. This is appreciated from the INT equation (1) where as noted that INT, and hence $R_b$ is high whenever any comparator provides an interchange signal during a loop rotation in a sort mode. It is only when all of the data records in each column have been properly ordered, that all the processing elements remain in the through state for a complete loop rotation.

It can be appreciated therefore, that the processing elements are arranged into odd and even phases such that the data records in any circulating loop $L_i$ will be compared to the data records occupying the same respective record positions in loop $L_{i+1}$ by processing elements $PE_i$ simultaneously with a comparison of the data records in loop $L_i$ to the data records occupying the same respective record positions in loop $L_{i-1}$ by processing element $PE_{i-1}$. The simultaneous comparison enables the sort to proceed more rapidly. Furthermore, it should be noted that the processing elements in the odd and even phases need not be located one-half loop length apart but may instead be separated by any desirable distance along the circulating loop.

Figure 10:
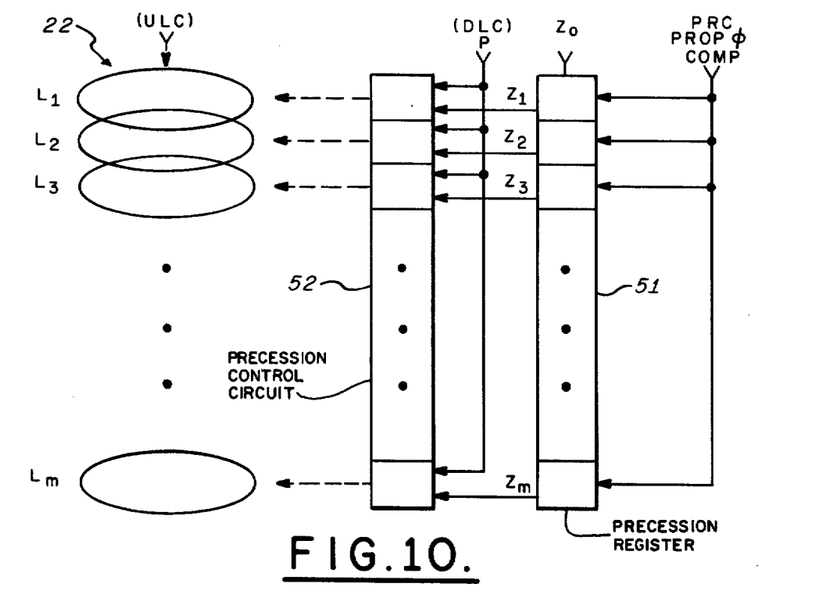
FIG. 10 is a block diagram illustrating apparatus comprising the precession sub-system of the memory.

FIG. 10 depicts the apparatus necessary to complete the second step or precession step of one pass of gyro sort. In addition to circulating storage loops 22 designated as $L_1, L_2 \ldots L_m$, and depicted in FIG. 4, the apparatus for effecting a data precession includes a precession register 51 and a precession control circuit 52 neither of which is illustrated in FIG. 4. Additionally, the precession register 51 and precession control circuit 52 are coupled to a plurality of control signals to be delineated hereafter.

It should be understood before proceeding, that two types of clocking may be utilized to effectuate precession: i) differential loop clocking in which the clock signals may be selectively applied to some loops and not to others, and ii) uniform loop clocking in which the clock is applied uniformly to all loops. Two types of clocking are considered because of the different technologies to which the invention may be addressed. Specifically, differential loop clocking is feasible in some technologies such as CCD memories, and not in others such as magnetic bubble memories. In the latter case, uniform loop clocking is typically provided by an external rotating magnetic field.

Referring once again to FIG. 10, the precession register 51 is comprised of a plurality of cells, one cell for each circulating storage loop. Each cell, for example cell $i$, of the precession register stores and modifies one bit which is used to determine the precession status of the associated storage loop $L_i$. A plurality of external control signals PRC, PROP$\phi$ and COMP, to be described hereinafter, are coupled to each cell in the precession register 51. Cell $i$ produces an output signal $Z_i$ which is coupled to cell $i+1$ and to the $i$th cell of the precession control circuit 52. Additionally, the first cell of the precession register 51 receives the boundary signal input $Z_0$.

The precession control circuit 52 is also comprised of one cell for each storage loop in the memory module 21. Cell $i$ in the precession control circuit 52 controls the precession of loop $L_i$, as indicated by the dashed lines.

Figure 11:
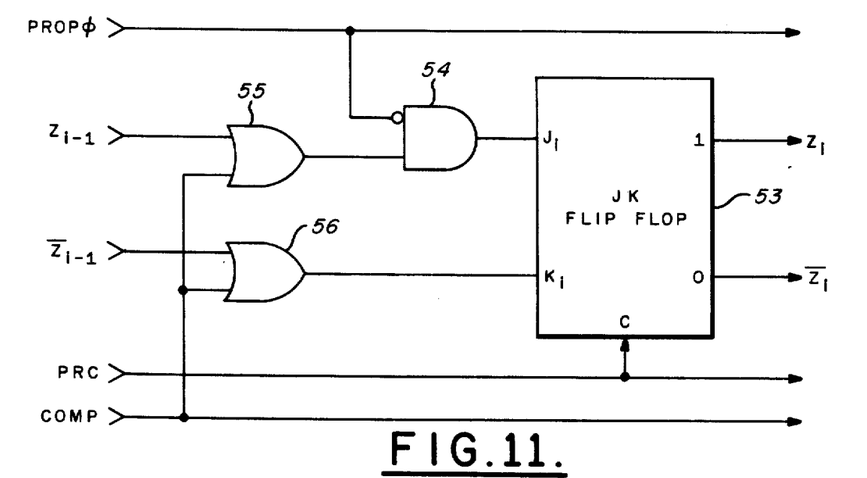
FIG. 11 is a logic diagram illustrating the operation of each cell within the precession register.

FIG. 11 illustrates a logic diagram of cell $i$ in precession register 51. The three external control lines PRC, COMP and PROP$\phi$ denoted above, are applied to cell $i$. The signals COMP and PROP$\phi$ are arranged so that they are never simultaneously equal to a logical 1, that is, $$COMP \cdot PROP\phi = 0 \qquad (2)$$

As illustrated in FIG. 11, the logic for cell i in precession register 51 may be represented by a flip-flop 53, coupled to an AND gate 54 and a pair of OR gates 55 and 56.

If $PROP\phi = 0$, then, $$J_i = Z_{i-1} + COMP$$

$$K_i = \overline{Z}_{i-1} + COMP$$

If, in addition, $COMP = 0$, then $$J_i = Z_{i-1}$$

$$K_i = \overline{Z}_{i-1}$$

so that a PRC pulse shifts the precession register contents by one cell position. Alternatively, if $COMP = 1$ then $$J_i = 1$$

$$K_i = 1$$

and therefore, a PRC pulse complements the precession register.

If, on the other hand, $PROP\phi = 1$ then $COMP = 0$ and $$J_i = 0$$

$$K_i = \overline{Z}_{i-1}$$

so that a PRC pulse will propagate zeroes but does not propagate ones.

Figure 12:
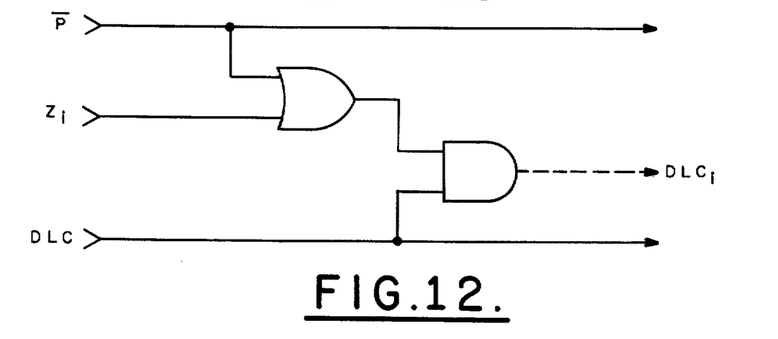
FIG. 12 is a logic diagram illustrating the operation of a cell in the precession control circuitry.

FIG. 12 illustrates a logic diagram for cell $i$ of the precession control circuit 52 applicable in situations where differential loop clocking is to be utilized. Two external control lines, P and DLC are shown. P represents the precession mode enable signal wherein, by definition, $P = 1$ if the memory module 21 is in the precession mode and $P = 0$ otherwise. DLC is the external loop clock signal described heretofore with regard to the discussion of FIG. 4. Cell $i$ of the precession control circuit 52 computes the signal $DLC_i$ used to clock circulating storage loop $L_i$ as a function of P, DLC and the input $Z_i$ from the precession register 51. This function is given by $$DLC_i = DLC \cdot (\overline{P} + Z_i) \qquad (3)$$

If $P = 0$, then $$DLC_i = DLC$$

resulting in the uniform clocking of all storage loops by the signal DLC. If $P = 1$, then $$DLC_i = DLC \cdot Z_i$$

so that the clock signal DLC is selectively distributed to storage loops $L_i$ where the input $Z_i = 1$. Storage loops $L_i$ in which $Z_i = 0$ are not clocked. Furthermore, it should be apparent that a variety of circuits may be utilized to effectuate both the precession control circuit 52 and the precession register 51.

If memory refresh is necessary, depending on the type of apparatus used for the circulating storage loops, then, the clock signal $DLC_i$ may be interleaved with an external refresh clock (not shown) which provides background loop circulation at the refresh rate and, as will become apparent hereinafter, will not interfere with the precession of the data records in each circulating storage loop. Memory refresh may also be accomplished during precession by interposing intervals in which $P = 0$ among intervals in which $P = 1$.

Figure 13:
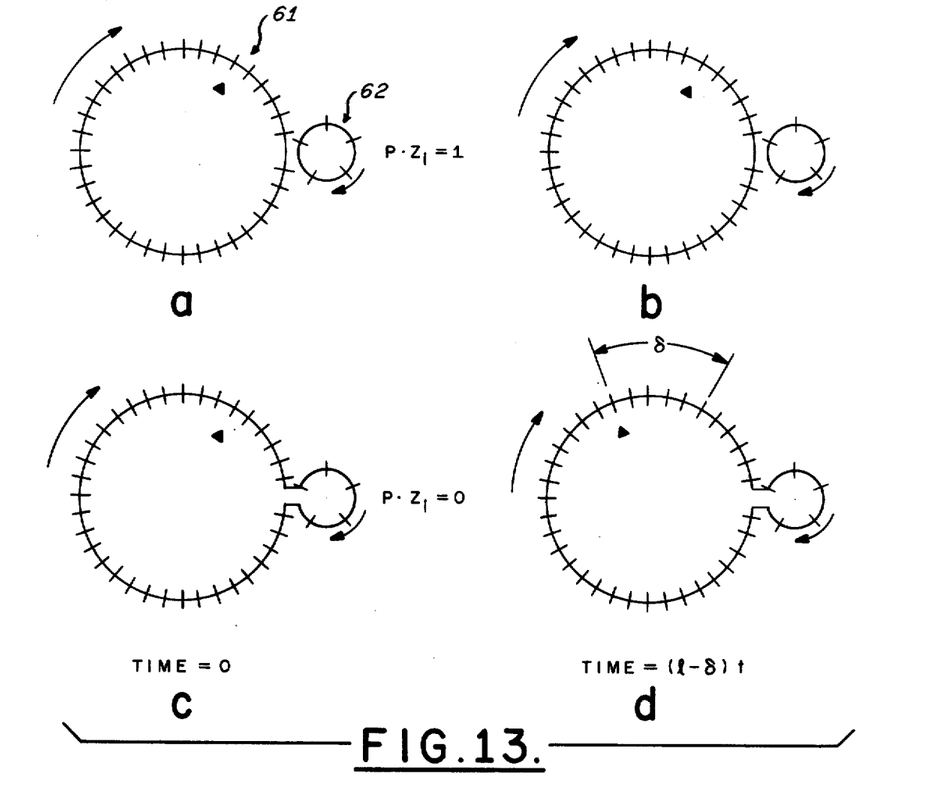
FIG. 13 is a graphic illustration of one form of precession control incorporated in the present invention.

FIG. 13 is a graphic illustration presented to aid in understanding the precession control circuit used in modules where uniform loop clocking is utilized, that is, modules where all storage loops are clocked uniformly at all times. In FIG. 13, each circulating storage loop $L_i$ is comprised of two sub-loops, the main loop 61 and an auxiliary loop 62. The total capacity of loop $L_i$ is $l$ bytes. This capacity is apportioned into $l - \delta$ bytes for the main loop 61 and $\delta$ bytes for the auxiliary loop 62, where $l$ is an integer multiple of $\delta$. The precession control is accomplished by a two-input, two-output loop switch (not shown) at the junction of the main and auxiliary loops which either isolates the sub-loop from the main loop, as depicted in FIGS. 13a and b, or interconnects them as depicted in FIGS. 13c and d.

The state of the loop switch in precession control cell $i$ is determined by the logical expression $P \cdot Z_i$ as indicated in FIG. 13. When the memory is in the precession mode ($P = 1$), the loop switch assumes the isolate state when $Z_i = 1$ and the interconnect state when $Z_i = 0$. At all other times ($P = 0$), the loop switch maintains the interconnect state. ULC represents the clock, for example, a rotating magnetic field, which circulates the loop contents. DLC is not present when uniform loop clocking is utilized.

FIG. 13 illustrates the phase difference introduced in precession mode between a loop for which $P \cdot Z_1 = 1$, e.g., FIGS. 13a, and b, and a loop for which $P \cdot Z_j = 0$, e.g. FIGS. 13c and d, during a time interval $(l-\delta)t$, where t is the one-byte shift time in seconds. The triangular marker in FIG. 13 points to an arbitrary but fixed reference position relative to the loop contents. The reference position at time $t = 0$ is shown in FIGS. 13a and c and at time $(l - \delta)t$ in FIGS. 13b and d. It is apparent therefrom, that a phase difference of $\delta$ bytes has been introduced between the data in the two circulating storage loops.

In FIG. 13b, the data in the auxiliary loop occupies the same position with respect to the data in the main loop as in FIG. 13a. Therefore, a transition to $Z_i = 0$ at a time $(l - \delta)t$ will terminate the differential phasing while preserving the original ordering of the stored data. If $Z_i$ is held at a logical 1 for an integer number $s$ of time intervals each equal to $(l-\delta)t$, then a total phase differential of $s\delta$ is introduced in loop $L_i$ with respect to a loop $L_j$ for which $Z_j$ is equal to 0 over the same period of time. If $s\delta$ is equal to the length of one data record, it is apparent that a phase shift of one data record position has occurred with respect to the data records in loops $L_i$ and $L_j$.

A complete operation of step two in any pass of gyro sort is described below and the performance thereof is given with respect to the following parameters:

Total loop length = $l$ bytes
Data record length = $q$ bytes
Auxiliary loop length (for uniform clocking) = $\delta$ bytes
Number of loops = $m$
One byte transfer time = $t$ seconds In order to insure proper operation, $l$ must be an integer multiple of $q$, and $q$ must be an integer multiple of $\delta$. Furthermore, $l = k \cdot q$, where $k$ is the loop packing factor (i.e., the number of records stored per loop) and $q = s \cdot \delta$, where $s$ is the record length in units of $\delta$.

For a loop packing factor $k \geq 2$, the precession register 51 in FIG. 11 is initially loaded by a boundary signal presented at the input $Z_O$ comprising $[m/k]$ applications of the $k$-bit word $$0111\ldots1$$

where $[m/k]$ denotes the smallest integer greater than or equal to $m/k$. This results in initial Z-input values to the precession control circuit 52 as follows:

$$Z_i = \begin{cases} 0 & \text{if } i \bmod k = 1 \\ 1 & \text{otherwise} \end{cases}$$

The precession register 51 need only be set once typically, at the time the memory is configured for a given packing factor $k$. The time required to present the precession register according to the boundary signal is approximately $m\tau$ where $\tau$ is the one-bit shift time of the precession register. Alternatively, the preset time may be reduced by partitioning the register into a number of segments and loading the segments in parallel, but this would require extra hardware to determine the appropriate phasing of each segment.

During periods when the memory is not in the precession mode, i.e., $P = 0$, the precession sub-system is effectively uncoupled from the rest of the memory. For example, during the time when the precession register is being preset or when a column sort is being performed the precession sub-system is decoupled therefrom.

After the precession register is preset, the following steps by the precession sub-system will result in completing step 2 (row precession) of a pass of gyro sort, wherein each loop $L_i$ is said to be active if $Z_i$ is equal to 1 and inactive otherwise.

Step 1: Initiate precession mode by setting P (precession mode enable) = 1.
Step 2: Advance active loops by $q$ byte positions relative to the inactive loops.
Step 3: Set PROP$\phi$ equal to 1 and apply a single pulse to PRC. Thereafter, reset PROP$\phi$. (This results in a propagation of zeroes in the precession register).
Repeat steps 2 and 3 alternately, so that both are performed $k-2$ times.
Step 4: Repeat step 2.
Step 5: Reset P, thereby terminating the precession mode.
Step 6:

a. Set $Z_0 = 1$ and shift the precession register by applying a single pulse to PRC;

b. Complement the precession register by setting COMP = 1 and applying a single pulse to PRC, thereby resetting the precession register to its initial state. RESET COMP.

Figure 14:
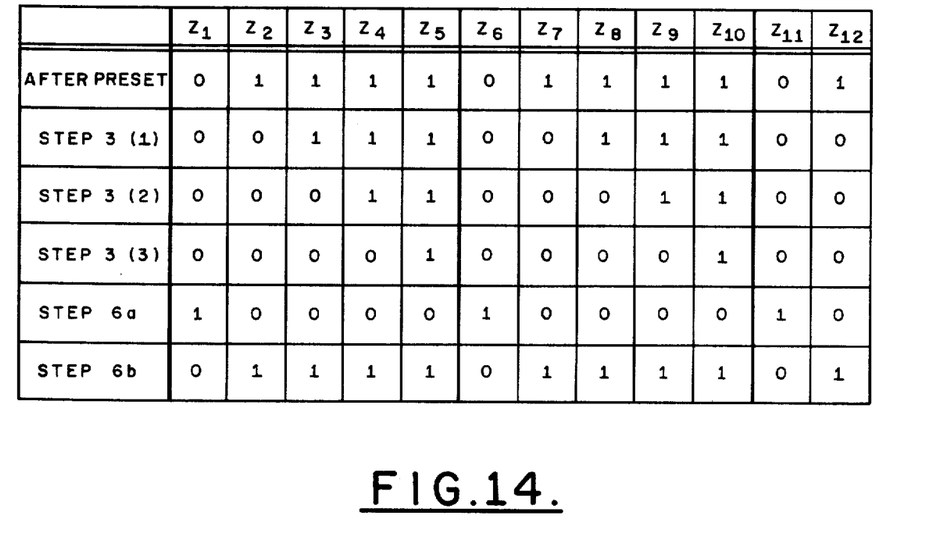
FIG. 14 is a tabular example of the activity within the precession sub-system during precession.

FIG. 14 illustrates in tabular form the various values for $Z_i$ as the precession progresses in a memory module where $m = 12$ and $k = 5$.

The means for accomplishing steps 2 and 4 above depend on whether differential loop clocking or uniform loop clocking is to be utilized. For differential loop clocking, DLC (See FIG. 12) is pulsed a number of times equal to $l$ byte positions. For uniform loop clocking, ULC is applied a number of times equal to $s(l-\delta)$ byte positions. In both instances, steps 2 and 4 may be initiated asynchronously with respect to the rotational position of the loop contents.

Furthermore, in situations where uniform loop clocking is utilized, if the precession register logic is clocked by the storage loop clock (i.e., PRC is identical to ULC) then steps 2 and 3 may be partially concurrent. A similar situation applies to steps 4 and 5.

The timing for gyro sort will obviously vary depending on whether differential loop clocking or uniform loop clocking is utilized. For example, when differential loop clocking is incorporated, precession time (for one data record position) is approximately $r = lt$ seconds (this expression has been approximated since $(k-1) qt$ seconds is the actual time required). For uniform loop clocking, the precession time is approximately $(k-1) sr$ seconds. Since $(k-1)$ separate precession steps are required, the component of the total gyro sort attributable to precession time equals:

$(k-1)r$ seconds for differential loop clocking $(k-1)^2 sr$ seconds for uniform loop clocking As earlier indicated, column sort time is at most $mr/2$ seconds and is repeated a total of $k$ times. Therefore, the total worst case time for a complete gyro sort is:

$[(mk/2) + (k-1) r$ seconds for differential loop clocking $[(mk/2) + (k-1)^2 s]$ seconds for uniform loop clocking.

It can be appreciated from the above equations, that, with respect to the differential loop clocking, column sort time predominates when $m >> 2$. Similarly, when uniform loop clocking is utilized, column sort timing predominates when $m >> (2l/\delta)$.

It will be appreciated from the foregoing that two systems for performing precession are described herein. The differential loop clocking (DLC) system does not utilize the main and auxiliary loops of FIG. 13. The uniform loop clocking (ULC) system does utilize these loops. In the ULC system each of the loops of FIG. 4 is comprised of a main loop and an auxiliary loop as illustrated in FIG. 13 with the switch controlled by the logic function P.Z. included to control the required isolation and connection of the main and auxiliary loops.

Data files may be loaded into or unloaded from the memory by utilizing one of the two data ports as the load or unload port and appropriately terminating the other port. The memory is initially cleared and memory loading is achieved by invoking the appropriate sort operation with a key field spanning any data field known to be non-zero, which may be the entired record. The file is presented serially at the input terminal of the load port.

Memory unloading is performed in a similar manner. An appropriate constant, 0 or 1, is presented at the input terminal of the unload port, a sort operation is initiated, and the file appears serially at the output terminal of the unload port.

Loading or unloading the entire memory requires $mr$ seconds. Concurrent loading and unloaing is possible whenever the load file has a data field whose values are uniformly less than or greater than the values assumed by the corresponding data field in the unload file. This condition may be effected independently of the data by dedicating a single bit in each record for this purpose. Concurrent loading and unloading of the entire memory requires $mr$ seconds.

The time to load may be further reduced by partitioning the memory into a number of segments and loading the segments in parallel from a like number of data sources. The same consideration applies to unloading the memory into a like number of data sinks.

A final row sort is required to obtain a completely ordered file. This can be accomplished using small auxiliary sorting memories of the kind described in Ser. No. 578,685 in conjunction with memory unloaded without introducing significant delay.

The present invention may be incorporated into the digital memory disclosed in copending application Ser. No. 578,685. As may be expected, the memory module 21 will not be as simple as described herein but the incorporation of the present invention is relatively straightforward once the apparatus of the "gyro" sort is understood. The incorporation of this invention into the digital memory described in Ser. No. 578,685 provides a memory which can perform all the functions in copending application Ser. No. 578,685 including search, retrieval, undate, and loop reconfiguration, as described therein. The complexity of the processing element, however, must necessarily be increased to provide the extra functions as disclosed in said Ser. No. 578,685.

While the invention has been described in its preferred embodiments, it is to be understood that the words which have been used are words of description rather than limitation and that changes within the purview of the appended claims may be made without departing from the true scope and spirit of the invention in its broader aspects.

We claim:

1. In a multi-record circulating loop memory system, apparatus for sorting the data records contained therein comprising a plurality of circulating loop means having $k$ record positions therein for storing $k$ data records, where $k$ is a positive integer, and wherein columns of data records are formed comprising a data record from each circulating loop means and where said data records forming said columns are disposed in the same record position within their respective circulating loop means;

first data processing circuit means for performing data comparisons of a predetermined type suitable for sorting in accordance with predetermined criteria, said comparisons being performed in each of said columns between data records disposed in the same column and re-ordering said data records within their respective columns according to said comparisons;

second data processing circuit means for precessing the data records stored within said memory system such that the data records disposed in each circulating loop means are shifted a record position, in a common direction, with respect to the data records in the next preceding circulating loop means; and means for coupling data manipulation control signals from said memory system to said first and second data processing circuit means including signals for operating said first and second data processing circuit means alternately wherein, subsequent to $k$ operations of said first data processing circuit means and $k-1$ operations of said second data processing circuit means, the data records stored in each circulating loop means are sorted with respect to the data records disposed in every other circulating loop means.

2. The apparatus as described in claim 1 wherein said second data processing circuit means comprises precession register means for storing and manipulating a precession state signal from said means for coupling data manipulation control signals and generating therefrom a precess signal for each of said circulating loop means with which the precession of each circulating loop means is determined; and precession control means coupled to said circulating loop means, said means for coupling data manipulation control signals, and said precession register means for precessing each said circulating loop means in response to said precess signal in conjunction with a precession enable signal from said means for coupling data manipulation control signals.

3. The apparatus as described in claim 2 wherein each circulating loop means includes main loop means comprising a substantial portion of the length, with respect to units of storage capacity, of said circulating loop means, auxiliary loop means comprising the remainder of the length of said circulating loop means wherein the length of said main loop means is an integer multiple of the length of said auxiliary loop means, and switching means for coupling said auxiliary loop means to said main loop means and responsive to said precession control means, such that for the appropriate precess signal in conjunction with said precession enable signal said switching means isolates said auxiliary loop means from said main loop means prohibiting the data disposed therein from circulating through said circulating loop means with the data disposed in said main loop means, whereby a circulation of the the data records in all circulating loop means through a length equal to the length of said main loop means multiplied by $s$, where $s$ is an integer and $s$ multiplied by the length of said auxiliary loop means equals the length of a data record, results in a precession of the data records in said circulating loop means wherein said switching means maintains coupling between said main and auxiliary loop means with respect to the data records stored in said circulating loop means in which said main and auxiliary loop means are isolated by said switching means; and wherein, after said circulation, the ordering of said data records within, said circulating loop means isolated by said switching means is maintained subsequent to re-coupling between said main and auxiliary loop means.

4. The apparatus of claim 1 wherein said first data processing circuit means comprises a plurality of loop processing circuit means is serially coupled in each of two said circulating loop means, and each said circulating loop means being serially coupled through two said loop processing circuit means at different points of said loop means, respectively.

5. The apparatus as described in claim 4 wherein said loop processing circuit means comprises:

comparator means, responsive to signals from said means for coupling data manipulation control signals, for comparing each data record disposed in the first circulating loop means associated with said loop processing circuit means with the data record disposed in the same column of the second circulating loop means associated with said loop processing circuit means thereby means associated with said loop processing circuit means thereby making data comparisons, and generating in response to each said data comparison, an interchange signal where re-ordering is necessary as defined by said signal from said means for coupling data manipulation control signals, and loop control means, responsive to said comparator means, for maintaining, in the absence of an interchange signal, the disposition of compared data records within their respective circulating loop means, and in the presence of said interchange signal, for interchanging the compared data records between the associated circulating loop means such that the compared data records, in either event, are maintained within said same column, whereby a sorting operation, with respect to the data records in each column, is performed after a plurality of said data comparisons.

6. The apparatus as described in claim 1 wherein said memory system further includes at least one data port means, responsive to said means for coupling data manipulation control signals, and coupled to an extremity of said plurality of circulating loop means for loading and unloading data into and out of said memory system respectively.

7. The apparatus as described in claim 6 further including means, responsive to said means for coupling data manipulation control signals, and coupled between said data port means and said extremity of said plurality of circulating loop means for sorting the data records disposed in each circulating loop as said data records are unloaded from said memory system.

8. The apparatus as described in claim 5 wherein said loop processing circuit means perform a plurality of data manipulation functions in addition to sorting in response to signals from said means for coupling data manipulation control signals as said data records circulate through said loop processing circuit means.

9. The method, utilizing the circulating loop memory system of claim 1 including a memory, of sorting the contents of said memory which includes a plurality of circulating storage loops each containing $k$ data records, where $k$ is a positive integer and wherein $k$ columns of data records are formed each of which is comprised of a data record from each circulating storage loop and wherein said data records comprising said columns are disposed in the same position within their respective circulating loops; comprising in combination the steps of:

arranging in sorted order according to predetermined criteria the data records disposed in each column utilizing said first data processing circuit means;

precessing the data records in each circulating loop, utilizing said second data processing circuit means, such that the data records disposed in each circulating loop are shifted a record position, in a common direction, with respect to the data records disposed in the next adjacent circulating storage loop; and repeating the above-mentioned steps alternately until the $k$th operation of arranging said columns in sorted order is performed, whhereupon the data records disposed in each circulating storage loop will be sorted with respect to the data records disposed in every other circulating storge loop.

10. The method as described in claim 9 wherein the step of arranging a column of data records in sorted order, comprises in combination the steps of a. comparing each data record disposed in each circulating storage loop with the data record disposed in the preceding circulating loop with the same column except for the first circulating storage loop, b. comparing each data record disposed in each circulating loop with the data record disposed in the succeeding circulating storage loop within the same column, except for the last circulating storage loops, and repeating steps (a) and (b) alternately for at most $m/2$ times where $m$ is equal to the number of circulating storage loops.

11. The method as described in claim 9 wherein the step of precessing comprises in combination the steps of:

combining said circulating storage loops into successive groups each comprised of $k$ circulating loops and a final group containing the remaining circulating loops where the number of circulating storage loops is not an integer multiple of $k$, and shifting the data records in each circulating loop within each group a total of $n-1$ record positions where $n$ corresponds to the number of each loop within its group and $n$ is a positive integer $\leq k$.

12. The method as described in claim 9 further including the step of sorting the data records within each circulating storage loop thereby effecting a complete sort of the data records stored within the memory.

* * * * *